United States Patent
Lyons et al.

(10) Patent No.: US 7,169,711 B1
(45) Date of Patent: Jan. 30, 2007

(54) METHOD OF USING CARBON SPACERS FOR CRITICAL DIMENSION (CD) REDUCTION

(75) Inventors: Christopher F. Lyons, Fremont, CA (US); Philip A. Fisher, Foster City, CA (US); Richard J. Huang, Cupertino, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 596 days.

(21) Appl. No.: 10/170,984

(22) Filed: Jun. 13, 2002

(51) Int. Cl.
*H01L 21/302* (2006.01)

(52) U.S. Cl. .............. 438/717; 438/618; 438/701; 438/702; 438/703; 438/712; 438/FOR. 100; 438/FOR. 117; 438/FOR. 133; 216/39; 257/E21.305; 257/E21.249

(58) Field of Classification Search ........... 438/618, 438/700, 701, 703, 696, 707, 712, 713, 717, 438/736, 702, 947, FOR. 117, FOR. 118, 438/FOR. 133, FOR. 100, FOR. 113; 216/39; 257/E21.305, E21.49
See application file for complete search history.

(56) References Cited

U.S. PATENT DOCUMENTS

| | | | | |
|---|---|---|---|---|
| 4,707,218 A | * | 11/1987 | Giammarco et al. | 438/421 |
| 5,445,710 A | * | 8/1995 | Hori et al. | 738/717 |
| 5,882,535 A | * | 3/1999 | Stocks et al. | 216/18 |
| 2001/0035558 A1 | * | 11/2001 | Smith et al. | 257/408 |
| 2003/0091938 A1 | * | 5/2003 | Fairbairn et al. | 430/314 |

* cited by examiner

*Primary Examiner*—George Fourson
*Assistant Examiner*—Julio J. Maldonado
(74) *Attorney, Agent, or Firm*—Foley & Lardner LLP

(57) ABSTRACT

A method of using carbon spacers for critical dimension reduction can include providing a patterned photoresist layer above a substrate where the patterned photoresist layer has an aperture with a first width, depositing a carbon film over the photoresist layer and etching the deposited carbon film to form spacers on lateral side walls of the aperture of the patterned photoresist layer, etching the substrate using the formed spacers and patterned photoresist layer as a pattern to form a trench having a second width, and removing the patterned photoresist layer and formed spacers using an oxidizing etch.

20 Claims, 4 Drawing Sheets

METHOD OF USING CARBON SPACERS FOR CRITICAL DIMENSION (CD) REDUCTION

FIELD OF THE INVENTION

The present disclosure relates generally to integrated circuits and methods of manufacturing integrated circuits. More particularly, the present disclosure relates to a method using carbon-containing spacers for critical dimension (CD) reduction.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). ICs often include flash memory cells.

Generally, a transistor is covered by a high temperature oxide (HTO) and an interlevel dielectric to insulate it from subsequently formed metal layers. An aperture or hole is etched through the interlevel dielectric and the high temperature oxide. The hole is filled with a conductive material to provide connections to the transistor, to conductors, or other circuit structures. For example, a contact can extend from the bit line through the interlevel dielectric to the drain of the transistor. In another example, a contact or conductive via can extend through the interlevel dielectric to connect to the gate stack.

As transistors disposed on integrated circuits (ICs) become smaller (e.g., transistors with gate lengths approaching 50 nm), CMOS fabrication processes must scale the dimensions of the transistors. That is, there must be proportional operational characteristics of structural elements in the ultra-small dimensions of a sophisticated transistor.

One problem associated with CMOS scaling involves forming of smaller and smaller apertures or spaces used in a variety of ways during the IC fabrication process. One way to shrink the critical dimension of "space" features, such as holes and trenches, is with the formation of spacers. However, the high temperature deposition process involved in conventional spacer formation requires additional etch and deposition steps.

In a conventional process, patterned photoresist is located above a spacer template of, for example, $SiO_2$ that is above a polysilicon substrate. The spacer template is etched, the photoresist is removed, and spacer film is deposited. The spacer structures are formed from the spacer film and serve to shrink the aperture size associated with the spacer template. The substrate is etched using the spacer structures in the patterning. The spacers and spacer template are removed after the trench in the substrate is formed.

There is a need for a simplified spacer process for reducing critical dimensions. Further, there is a need to deposit carbon and form spacers directly on the photoresist pattern. Yet further, there is a need to reduce critical dimensions in integrated circuit fabrication using low temperature amorphous carbon spacers.

SUMMARY OF THE INVENTION

An exemplary embodiment relates to a method of using carbon spacers for critical dimension reduction. The method can include providing a patterned photoresist layer above a substrate where the patterned photoresist layer has an aperture with a first width, depositing a carbon film over the photoresist layer and etching the deposited carbon film to form spacers on lateral side walls of the aperture of the patterned photoresist layer, etching the substrate using the formed spacers and patterned photoresist layer as a pattern to form a trench having a second width, and removing the patterned photoresist layer and formed spacers using an oxidizing etch.

Another exemplary embodiment relates to a method of reducing critical dimensions of holes or trenches. The method can include patterning photoresist above a substrate, depositing low temperature film including carbon above the patterned photoresist, etching the film to form spacers, etching the substrate or a layer above the substrate using the spacers and patterned photoresist as a mask, and removing the patterned photoresist and the spacers.

Another exemplary embodiment relates to a method of forming spacers directly on patterned photoresist to reduce critical dimensions in integrated circuit fabrications. The method can include depositing amorphous carbon material on patterned photoresist over a substrate, etching the deposited amorphous carbon spacer material to form carbon spacers, etching an aperture in the substrate using the carbon spacers and patterned photoresist as a mask, and removing the mask.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and.

DETAILED DESCRIPTION OF EXEMPLARY EMBODIMENTS

Figure 1:
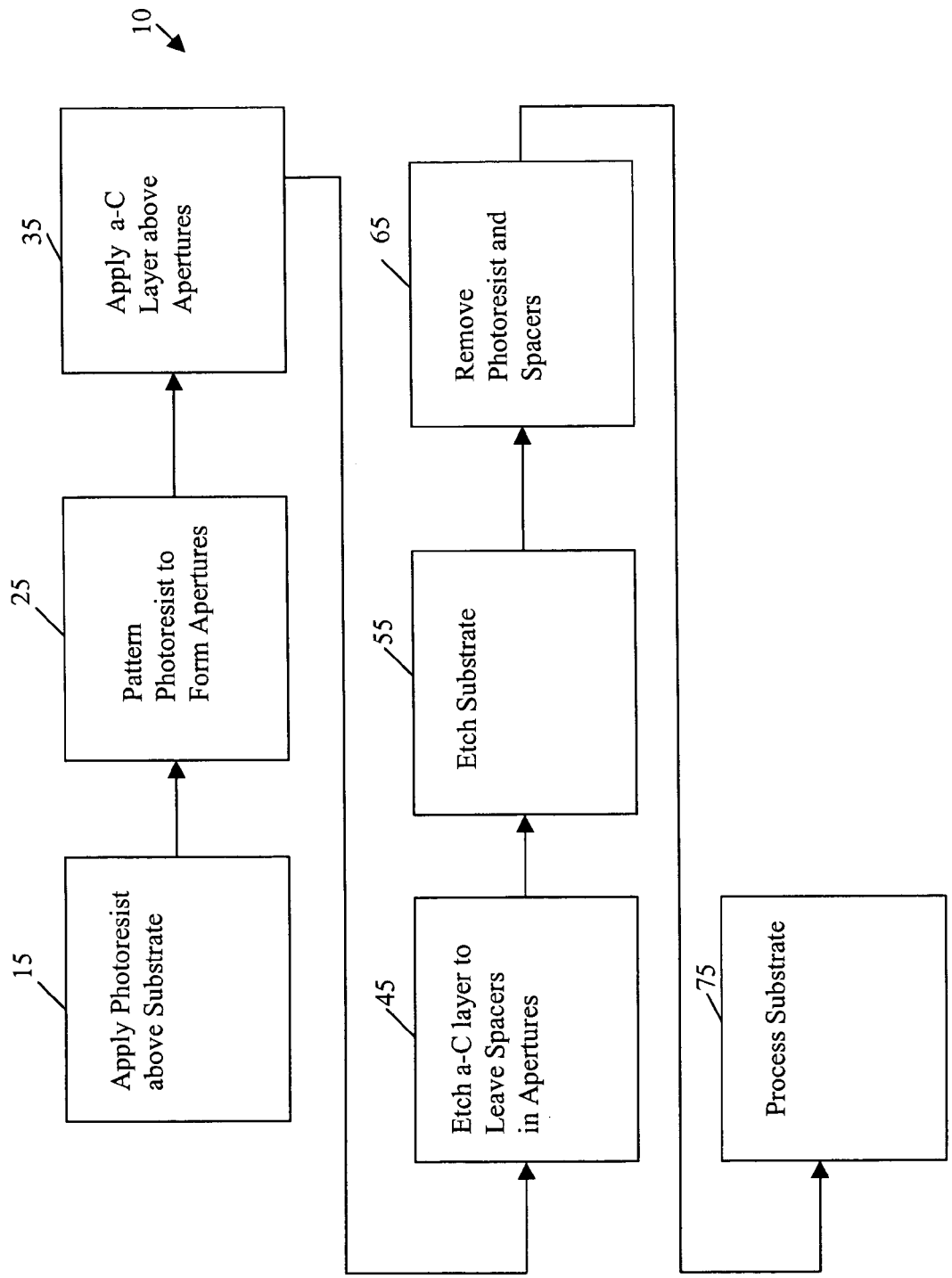
FIG. 1 is a flow diagram depicting an exemplary process for forming reduced width trenches in accordance with an exemplary embodiment.

FIG. 1 illustrates a flow diagram 10 depicting exemplary steps and a method of forming reduced width trenches. Flow diagram 10 illustrates by way of example, some steps that may be performed. Additional steps, fewer steps, or combinations of steps may be utilized in various different embodiments.

In an exemplary embodiment, in a step 15, a photoresist layer is applied above a substrate. A variety of different techniques may be used to apply the photoresist layer above the substrate layer, such as spin coating. One photoresist application step is described below with reference to FIG. 2. In a step 25, the photoresist layer is patterned to form apertures. Any of a variety of different patterning steps may be used to form the apertures in the photoresist layer, such as UV exposure and aqueous alkaline development. One photoresist patterning step is described below with reference to FIG. 3.

In a step 35, an amorphous carbon layer is applied above the photoresist layer. Any of a variety of different application techniques may be used to form the amorphous carbon layer above the photoresist layer, such as chemical vapor deposition. The amorphous carbon layer can be deposited at temperatures below the flow temperature of the photoresist pattern, or at temperatures that do not alter the photoresist pattern. One amorphous carbon layer application step is described below with reference to FIG. 4.

In a step 45, the amorphous carbon layer is etched to leave spacers in the apertures of the pattern photoresist layer. The amorphous carbon layer can be etched using a variety of different techniques, such as Reactive Ion Etching (RIE). One spacer formation step is described below with reference to FIG. 5.

In a step 55, the substrate is etched using the pattern photoresist layer and spacers as a mask. The spacers help to provide a smaller dimension to the etched trench in the substrate. Any of a variety of techniques may be used, such as Reactive Ion Etching (RIE). One substrate etching step is described below with reference to FIG. 6. In a step 65, the photoresist layer and spacers are removed. In a step 75, the substrate is further processed. The trench can be used as an isolation trench, as a contact hole or via, or a dielectric trench to be filled with a conductor.

Figure 2:
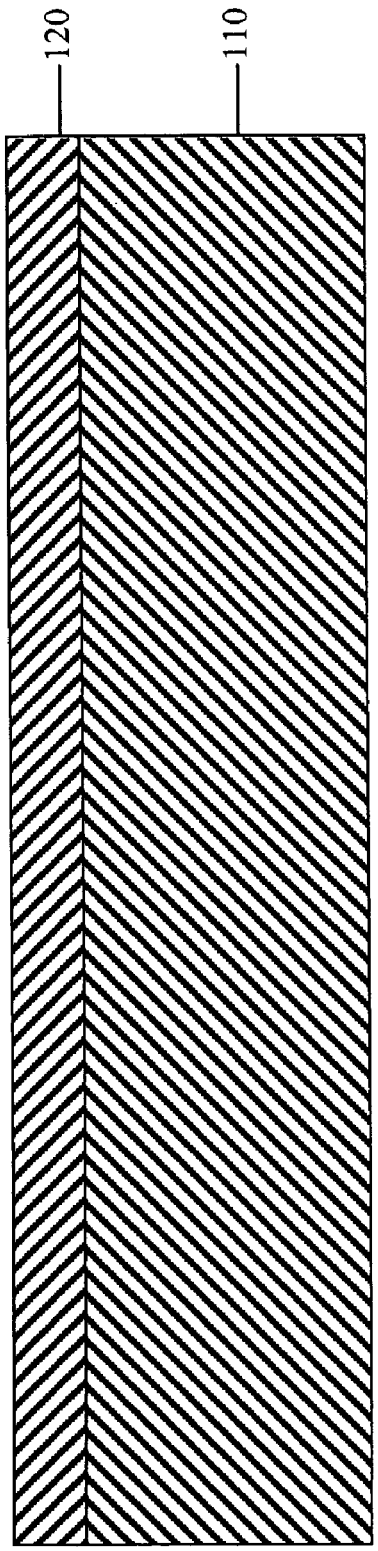
FIG. 2 is a schematic cross-sectional view representation of the portion of an integrated circuit, showing a stack application step in accordance with an exemplary embodiment.

Referring to FIG. 2, a portion 100 of an integrated circuit includes a substrate 110 and a photoresist layer 120. Photoresist layer 120 can be applied above substrate 110 using any of a variety of different techniques. In an exemplary embodiment, photoresist layer 120 has a thickness of 500 to 10,000 Angstroms. Substrate 110 can be a silicon-containing material or any of a variety of suitable materials.

Figure 3:
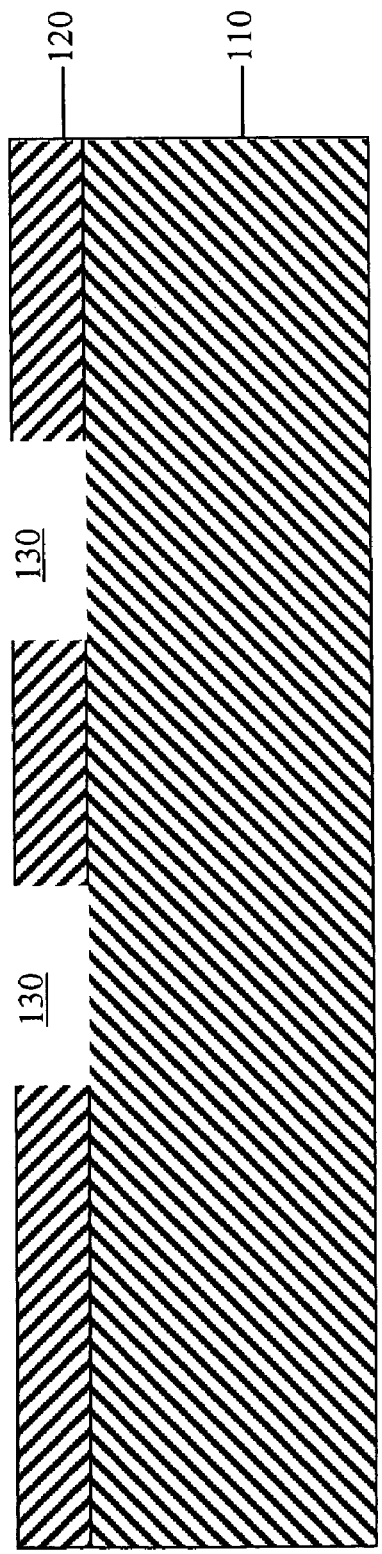
FIG. 3 is a schematic cross-sectional view representation of the portion of the integrated circuit of FIG. 2, showing a photoresist patterning step.

FIG. 3 illustrates portion 100 after a patterning step in which apertures 130 are formed by the patterning of photoresist layer 120. In an exemplary embodiment, apertures 130 have critical dimensions of 200 nm. Alternatively, apertures 130 can have a wide variety of different widths. Photoresist layer 120 can be patterned using a variety of different techniques, including the use of reticles or masks or direct writing.

Figure 4:
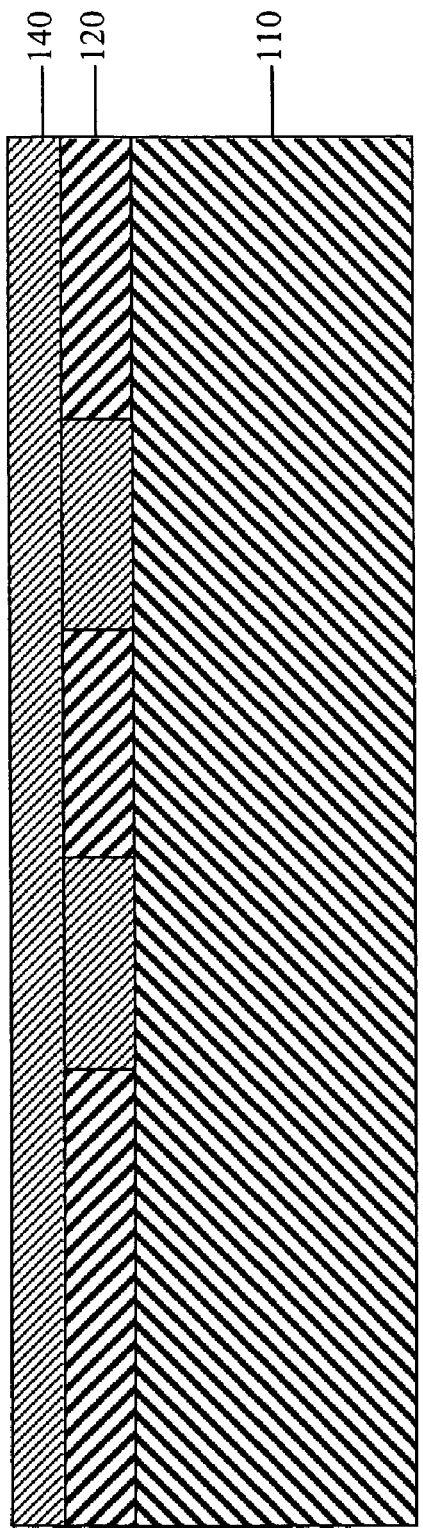
FIG. 4 is a schematic cross-sectional view representation of the portion of the integrated circuit of FIG. 2, showing a spacer film material layer deposition step.

FIG. 4 illustrates portion 100 after a spacer material film has been applied over photoresist layer 120 and substrate 110. Spacer material layer 140 can include a low temperature spacer material including a carbon material. Alternatively, spacer material layer 140 can include a crystalline (diamond-like) composition. Any of a variety of deposition processes may be used to apply spacer material layer 140 over a photoresist layer 120 and substrate 110. By way of example, chemical vapor deposition or physical vapor deposition may be utilized in applying spacer material layer 140.

Figure 5:
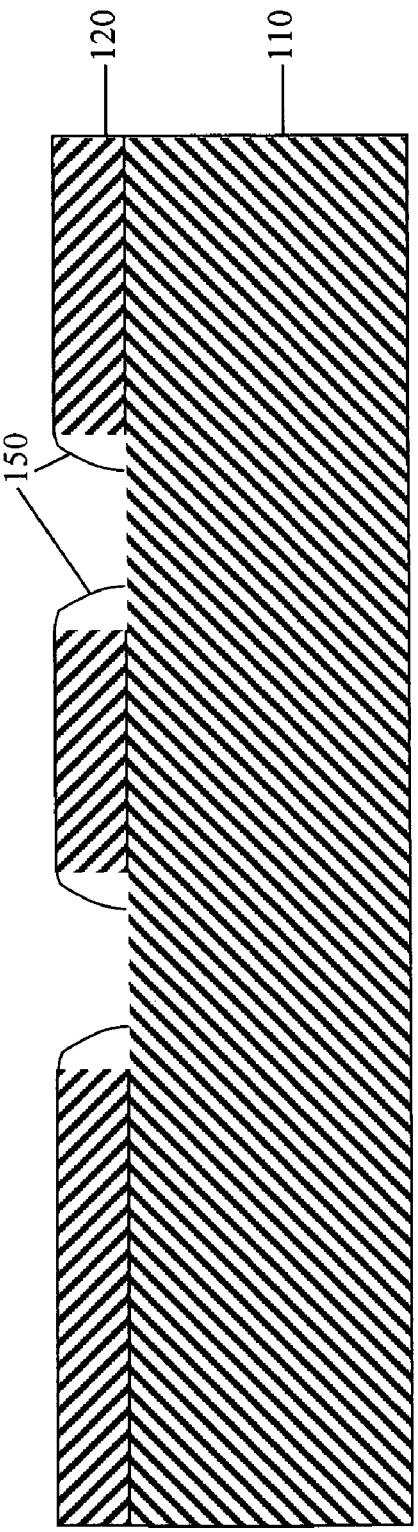
FIG. 5 is a schematic cross-sectional view representation of the portion of the integrated circuit of FIG. 2, showing a spacer formation step.

FIG. 5 illustrates portion 100 after a spacer formation process. In an exemplary embodiment, the spacer formation process includes an etching of spacer material layer 140 described with reference to FIG. 4. Spacers 150 are formed in apertures 130 formed during the patterning of photoresist layer 120 described with reference to FIG. 3 and filled with spacer material layer 140 described with reference to FIG. 4.

Spacers 150 can be formed by using a variety of different techniques. For example, CVD deposition of a carbon film from a hydrocarbon source gas followed by reactive ion etching (RIE) with an oxidizing plasma can be used. In an exemplary embodiment, spacers 150 have a rounded shape. Alternatively, spacers 150 can have a rectangular or any other shape. Spacers 150 can have a width at the point of contact with substrate 110 of, for example, 50 nm or more. Accordingly, spacers 150 can reduce the exposed portion of substrate 110 to 100 nm or less. The width of spacers 150 are determined by the resist pattern shape, the CVD deposition conditions and the spacer etch process. After substrate etching, spacers 150 and photoresist layer 120 are removed by an oxidizing plasma or other chemical processes that do not damage the substrate.

Figure 6:
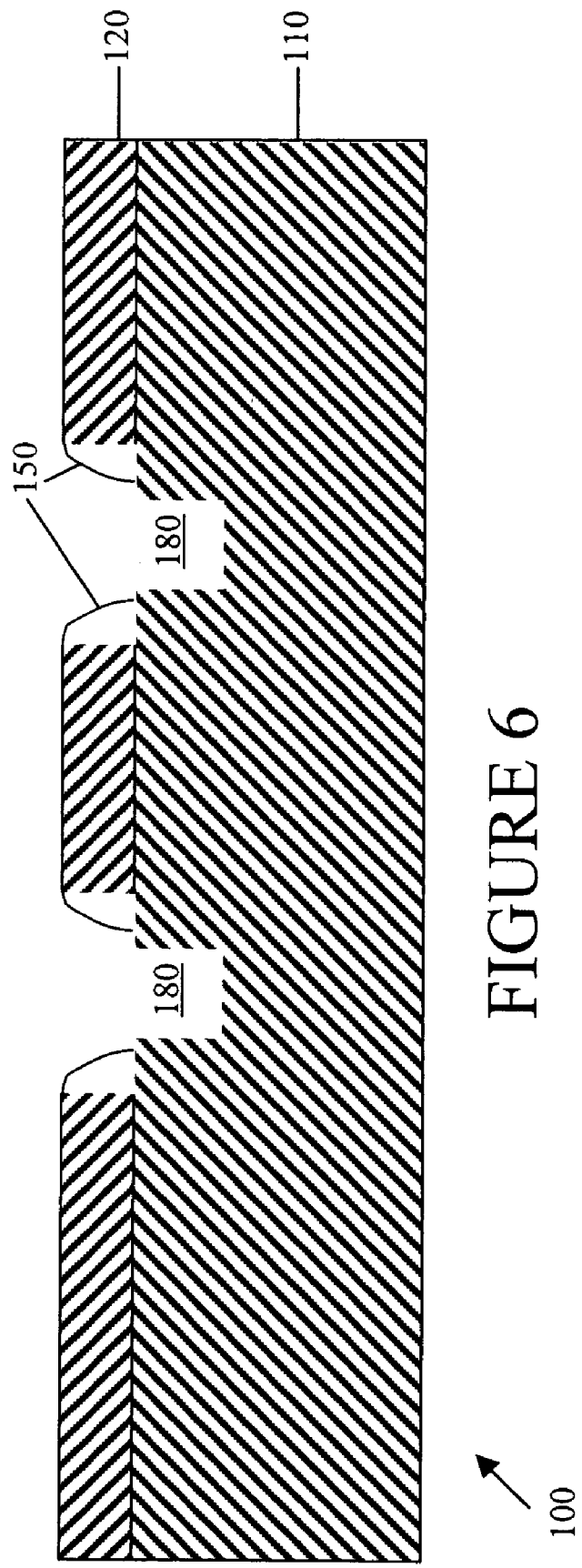
FIG. 6 is a schematic cross-sectional view representation of the portion of the integrated circuit of FIG. 2, showing a trench formation step.

FIG. 6 illustrates portion 100 after etching of substrate 110 is performed using spacers 150 and photoresist layer 120 as a mask. Etching of substrate 110 can form trenches 180. Advantageously, trenches 180 have a critical dimension (i.e., width) of 100 nm or less. Once trenches 180 are formed, spacers 150 and photoresist layer 120 can be removed using, for example, an oxidizing etch. Advantageously, an oxidizing etch does not damage substrate 110.

The process described with reference to the FIGURES results in a trench 180 in substrate 110 having a reduced width. Further, the process described uses carbon spacers 150 and helps to simplify the process of reducing critical dimensions. For example, conventional processes typically deposit spacer film, pattern photoresist on the spacer film, etch the spacer template, remove the photoresist, deposit spacer file, etch the spacer, etch the substrate, and remove the template film and spacer. In contrast, the process described with reference to the FIGURES includes patterning photoresist on the substrate, deposited a spacer film, etching the spacer, etching the substrate, and removing the photoresist and spacer. Advantageously, using a carbon spacer allows the spacer to be formed directly on the photoresist. Thus, some of the benefits of such a process include a reduced critical dimension, a simplified process, less expensive process equipment, reduced process time, reduced thermal cycling, lower defect levels, more simple re-work, etc.

While the exemplary embodiments illustrated in the FIGURES and described above are presently preferred, it should be understood that these embodiments are offered by way of example only. Other embodiments may include, for example, formation of gates or other integrated circuit features. The invention is not limited to a particular embodiment, but extends to various modifications, combinations, and permutations that nevertheless fall within the scope and spirit of the appended claims.

What is claimed is:

1. A method of using carbon spacers for critical dimension reduction, the method comprising:
    providing a patterned photoresist layer above a substrate, the patterned photoresist layer having an aperture with a first width;
    depositing an amorphous carbon film over the patterned photoresist layer and etching the deposited amorphous carbon film to form the carbon spacers on lateral side walls of the aperture of the patterned photoresist layer;
    etching the substrate using the formed carbon spacers and patterned photoresist layer as a pattern to form a trench having a second width, wherein the second width is 100 nm or less; and
    removing the patterned photoresist layer and formed carbon spacers using an oxidizing etch.

2. The method of claim 1, wherein the first width is at least 200 nm.

3. The method of claim 1, wherein the amorphous carbon film is deposited using chemical vapor deposition.

4. The method of claim 1, wherein depositing an amorphous carbon film includes depositing at temperatures that do not alter the patterned photoresist layer.

5. The method of claim 1, wherein depositing an amorphous carbon film includes using temperatures below the flow temperature of the patterned photoresist layer.

6. The method of claim 1, wherein the amorphous carbon film is etched using a reactive ion etch.

7. A method of using carbon spacers for critical dimension reduction, the method comprising:
   providing a patterned photoresist layer above a substrate, the patterned photoresist layer having an aperture with a first width;
   depositing an amorphous carbon film over the patterned photoresist layer and etching the deposited amorphous carbon film to form the carbon spacers on lateral side walls of the aperture of the patterned photoresist layer;
   etching the substrate using the formed carbon spacers and patterned photoresist layer as a pattern to form a trench having a second width; and
   removing the patterned photoresist layer and formed carbon spacers using an oxidizing etch, wherein the patterned photoresist layer has a thickness of 500–1,000 Å.

8. The method of claim 7, wherein the second width is 100 nm or less.

9. The method of claim 7, wherein the trench in the substrate has a width of 100 nm or less.

10. A method of reducing critical dimensions of holes or trenches, the method comprising:
    patterning a photoresist above a substrate, the patterned photoresist including an aperture having a width;
    depositing a low temperature film including amorphous carbon above the patterned photoresist;
    etching the low temperature film to form spacers;
    etching the substrate or a layer above the substrate using the spacers and patterned photoresist as a mask; and
    removing the patterned photoresist and the spacers, wherein the low temperature film has a thickness of 50 nm and the width of the aperture is 200 nm.

11. The method of claim 10, wherein the low temperature film has a thickness of between 25% and 50% of the width of the aperture.

12. The method of claim 10, wherein depositing low temperature carbon spacers includes depositing amorphous carbon by chemical vapor deposition.

13. The method of claim 10, wherein removing the patterned photoresist and the spacers includes providing an oxidizing etch.

14. A method of reducing critical dimensions of holes or trenches, the method comprising:
    patterning a photoresist above a substrate, the patterned photoresist including an aperture having a width;
    depositing a low temperature film including amorphous carbon above the patterned photoresist;
    etching the low temperature film to form spacers;
    etching the substrate or a layer above the substrate using the spacers and patterned photoresist as a mask; and
    removing the patterned photoresist and the spacers, wherein etching the substrate or the layer above the substrate forms a trench with a width of 100 nm or less.

15. The method of claim 14, wherein the low temperature film has a thickness of 50 nm and the width of the aperture is 200 nm.

16. A method of forming spacers directly on a patterned photoresist to reduce critical dimensions in integrated circuit fabrications, the method comprising:
    depositing a amorphous carbon spacer material on the patterned photoresist over a substrate;
    etching the deposited amorphous carbon spacer material to form the spacers;
    etching an aperture in the substrate using the spacers and the patterned photoresist as a mask; and removing the mask, wherein the aperture in the substrate has a width of 100 nm or less.

17. The method of claim 16, wherein the aperture is configured as an isolation trench.

18. The method of claim 16, wherein etching the deposited amorphous carbon spacer material to form the spacers includes providing oxidizing plasma.

19. The method of claim 16, wherein removing the mask includes oxidizing the mask away.

20. The method of claim 16, wherein etching the deposited amorphous carbon spacer material to form the carbon spacers includes a chemical vapor deposition (CYD) process.

* * * * *

UNITED STATES PATENT AND TRADEMARK OFFICE
CERTIFICATE OF CORRECTION

| | | |
|---|---|---|
| PATENT NO. | : 7,169,711 B1 | Page 1 of 1 |
| APPLICATION NO. | : 10/170984 | |
| DATED | : January 30, 2007 | |
| INVENTOR(S) | : Christopher F. Lyons et al. | |

It is certified that error appears in the above-identified patent and that said Letters Patent is hereby corrected as shown below:

Column 6:
line 25, replace "a" with --an--.
line 42, replace "(CYD)" with --(CVD)--.

Signed and Sealed this

Tenth Day of April, 2007

JON W. DUDAS
*Director of the United States Patent and Trademark Office*